United States Patent
Su et al.

(10) Patent No.: US 11,177,772 B2
(45) Date of Patent: Nov. 16, 2021

(54) POWER CONTROL CIRCUIT AND POWER AMPLIFICATION CIRCUIT

(71) Applicant: SMARTER MICROELECTRONICS (GUANG ZHOU) CO., LTD., Guangzhou (CN)

(72) Inventors: Qiang Su, Guangzhou (CN); Zhenfei Peng, Guangzhou (CN); Baiming Xu, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 121 days.

(21) Appl. No.: 16/590,371

(22) Filed: Oct. 1, 2019

(65) Prior Publication Data

US 2020/0036336 A1    Jan. 30, 2020

Related U.S. Application Data

(63) Continuation of application No. PCT/CN2018/079413, filed on Mar. 19, 2018.

(30) Foreign Application Priority Data

Apr. 5, 2017 (CN) .......................... 201710218475.1

(51) Int. Cl.
*H03F 1/02* (2006.01)
*H03F 1/30* (2006.01)
*H03F 3/19* (2006.01)
*H03F 3/20* (2006.01)

(52) U.S. Cl.
CPC ............. *H03F 1/0205* (2013.01); *H03F 1/30* (2013.01); *H03F 3/19* (2013.01); *H03F 3/20* (2013.01)

(58) Field of Classification Search
CPC ...................................................... H03F 1/0205
See application file for complete search history.

(56) References Cited

U.S. PATENT DOCUMENTS

| | | | | |
|---|---|---|---|---|
| 2003/0169094 A1* | 9/2003 | Zhang | ...... | H03F 1/32 327/513 |
| 2005/0083129 A1* | 4/2005 | Tsurumaki | ...... | H03F 1/301 330/285 |
| 2010/0093291 A1* | 4/2010 | Embabi | ...... | H03G 3/3042 455/127.2 |
| 2013/0307625 A1* | 11/2013 | Hershberger | ...... | H03F 3/19 330/285 |
| 2015/0378386 A1* | 12/2015 | Li | ...... | G05F 3/267 323/315 |
| 2019/0028060 A1* | 1/2019 | Jo | ...... | H04B 1/0475 |
| 2019/0296692 A1* | 9/2019 | Patel | ...... | H03F 1/3205 |

* cited by examiner

*Primary Examiner* — Patricia T Nguyen
(74) *Attorney, Agent, or Firm* — Syncoda LLC; Feng Ma

(57) ABSTRACT

A power control circuit includes: a voltage-current converter and a programmable current amplifier; the voltage-current converter is configured to detect an inputted output power control signal, and to convert the output power control signal to a control current and output same; and the programmable current amplifier is configured to receive the control current and output the amplified control current as a bias current of the power amplifier connected to the power control circuit.

19 Claims, 3 Drawing Sheets

POWER CONTROL CIRCUIT AND POWER AMPLIFICATION CIRCUIT

CROSS-REFERENCE TO RELATED APPLICATIONS

The present application is a continuation of, and claims priority to, PCT/CN2018/079413 filed on Mar. 19, 2018, which claims priority to Chinese Patent Application No. 201710218475.1 filed on Apr. 5, 2017. The disclosures of these applications are hereby incorporated by reference in their entirety.

BACKGROUND

At present, radio frequency power amplifiers, such as radio power amplifiers in the second generation (2G) global system for mobile communication (GSM), are widely deployed in the field of communications. The structures of a common GSM radio frequency power amplifier and a power control circuit thereof are illustrated in FIG. 1.

A signal of a radio frequency input port is amplified by a power amplifier U2 and is outputted from a radio frequency output port. A value of an output power of the radio frequency output port is controlled by a power control circuit, namely a voltage modulation circuit in FIG. 1.

As illustrated in FIG. 1, when an output power control signal VRAMP inputted to an error amplifier U1 of the voltage modulation circuit is increased, an output voltage Vout of a power transistor B1 is increased. Because the output voltage Vout is connected to a collector of a power amplifier U2, a collector voltage of the power amplifier U2 is also increased, thereby increasing an output power of the power amplifier U2 in a square relationship. Conversely, when the output power control signal VRAMP is decreased, the output power of the power amplifier is decreased in a square relationship. Therefore, by controlling a value of the output power control signal VRAMP, the output power of the power amplifier can be controlled.

In the practical application of the circuit illustrated in FIG. 1, a power transistor B1 in the voltage modulation circuit occupies a large chip area, and the chip area is increased as a current load capacity of the power transistor B1 is increased. In addition, the power transistor B1 in the voltage modulation circuit generates a voltage drop and consumes power, thereby reducing a maximum output power of the power amplifier U2 and reducing an efficiency of the power amplifier U2.

SUMMARY

The inventors of the present disclosure have recognized that, generally, the voltage modulation circuit is a closed loop. The stability of the voltage modulation circuit is related to bypass capacitor, a direct current of the power amplifier, a temperature, a power supply voltage VBAT, etc. In practical applications, the power amplifier easily generates low frequency oscillation due to poor stability. In addition, when the power of the power amplifier is controlled by the output power control signal VRAMP through the closed loop, it is easy to result in stray in a spectrum of the power amplifier due to the problem of the closed loop itself during a transient process, while resulting in that speeds of the transient response of different power levels differ greatly.

In view of this, the embodiments of the disclosure provide a power control circuit and a power amplification circuit.

In some embodiments, a power control circuit is provided, which includes a voltage-current converter and a programmable current amplifier.

The voltage-current converter is configured to detect an inputted output power control signal, convert the output power control signal into a control current, and output the control current.

The programmable current amplifier is configured to receive and amplify the control current, and output the amplified control current as a bias current of a power amplifier connected to the power control circuit.

In the above solution, the power control circuit may further include a waveform shaper configured to perform starting point offset on the control current with respect to the output power control signal.

In the above solution, the waveform shaper may include a constant current source.

In the above solution, the power control circuit may further include a temperature compensator configured to compensate the control current when a temperature changes.

In the above solution, the power control circuit may further include a voltage compensator configured to compensate the control current when a supply voltage of the power amplifier changes.

In the above solution, the temperature compensator may include a temperature controlled current source; and/or the voltage compensator may include a voltage controlled current source.

In the above solution, there may be a positive correlation relationship between an output current of the voltage-current converter and an input voltage of the voltage-current converter.

In the above solution, the positive correlation relationship may include a linear relationship, a piecewise linear relationship, a square relationship or an exponential relationship.

In the above solution, the control current may be linearly amplified by the programmable current amplifier, and an amplification factor of the programmable current amplifier is controlled by programming the programmable current amplifier through a control signal.

The embodiment of the disclosure provides a power amplification circuit, which includes a power amplifier and the power control circuit in the above technical solution.

The power control circuit is connected to the power amplifier and configured to input a bias current to the power amplifier.

The power amplifier is configured to amplify an inputted radio frequency signal according to the bias current, and then output the amplified signal.

In the power control circuit and the power amplification circuit in the embodiments of the disclosure, an inputted output power control signal is detected by a voltage-current converter, and the output power control signal is converted into a control current. By a programmable current amplifier, the control current is amplified and the amplified control current is outputted as a bias current of a power amplifier connected to the power control circuit. It can be seen that the power control circuit in the embodiment of the disclosure is an open loop circuit, and the power amplifier can be controlled without a power transistor. Compared with the related art, the adverse effects of the power transistor and a closed loop are eliminated, and the performance of the power amplification circuit is improved.

DETAILED DESCRIPTION

In some embodiments of the disclosure, a bias current Ibase of a power amplifier is controlled by a power control circuit controlled by an output power control signal VRAMP, so that the bias current Ibase changes with a value of the output power control signal VRAMP. Thus, since there is a positive correlation relationship between the bias current Ibase and an output power of the power amplifier, the output power control signal VRAMP controls the bias current Ibase to control the output power of the power amplifier.

The operation that the bias current Ibase changes with the value of the output power control signal VRAMP includes the following actions. The bias current Ibase is increased as the output power control signal VRAMP is increased, and the bias current Ibase is decreased as the output power control signal VRAMP is decreased.

In order to provide more detailed understanding of the features and technical content of the disclosure, the implementation of the disclosure will be described in detail below with reference to the accompanying drawings, and the accompanying drawings are for illustrative purposes only and are not intended to limit the disclosure.

Figure 1:
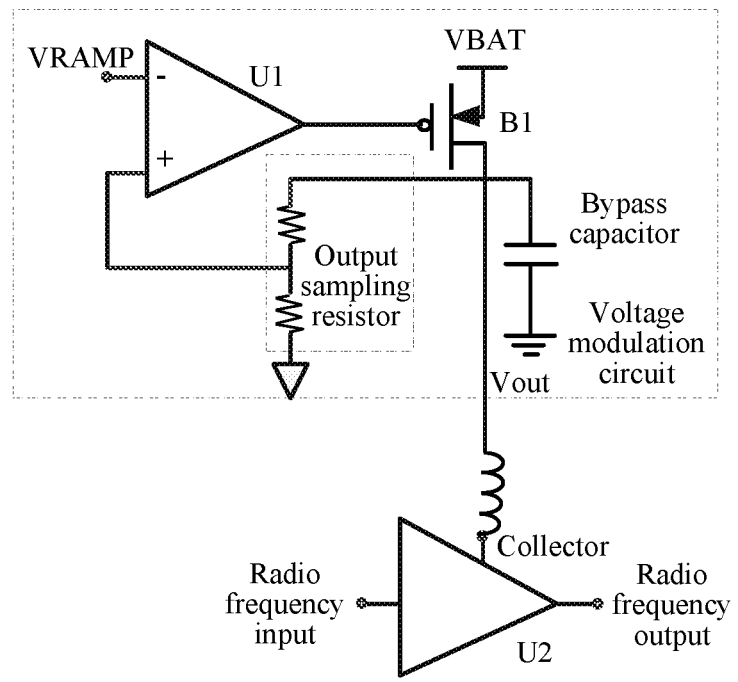
FIG. 1 is a schematic diagram illustrating a circuit composition structure of a power amplification circuit in the related art.
Figure 2:
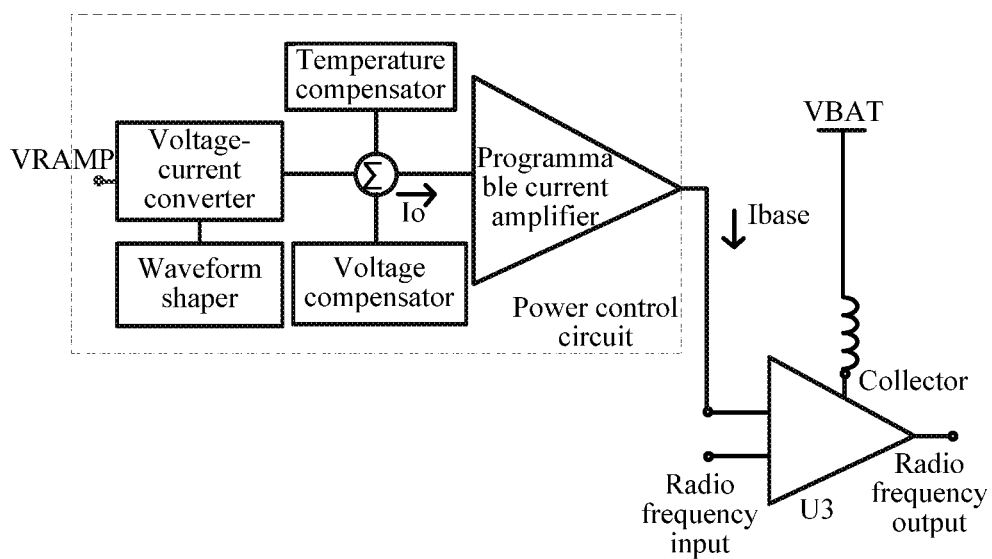
FIG. 2 is a schematic diagram illustrating a circuit composition structure of a power amplification circuit according to an embodiment of the disclosure.

FIG. 2 is a schematic diagram illustrating a circuit composition structure of a power amplification circuit according to an embodiment of the disclosure. As illustrated in FIG. 2, the power control circuit is connected to a power amplifier U3, and configured to input a bias current to the power amplifier U3. The power control circuit includes a voltage-current converter and a programmable current amplifier.

Specifically, the voltage-current converter is configured to detect an inputted output power control signal VRAMP, convert the output power control signal VRAMP into a control current Io, and output the control current.

The programmable current amplifier is configured to receive the control current Io outputted by the voltage-current converter, amplify the control current Io and output the amplified control current Io as a bias current Ibase of the power amplifier U3.

In the power control circuit in the embodiment of the disclosure, a voltage modulation circuit in the related art is not used, therefore, the problems are eliminated in the related art that the chip area is large, a maximum output power of the power amplifier is reduced and an efficiency of the power amplifier is reduced due to a power transistor when the voltage modulation circuit is used. In addition, the power control circuit in the embodiment of the disclosure has an open-loop structure, and there is no problem of stability. In a transient process, there is no interference of a closed loop, therefore, a spectral stray of the power amplifier is controlled, and a transient response of a different power level has a consistent speed.

Moreover, the programmable current amplifier linearly amplifies the control current Io to generate a bias current Ibase of the power amplifier. By programming the programmable current amplifier, an amplification factor here can be controlled by a control signal.

Figure 3:
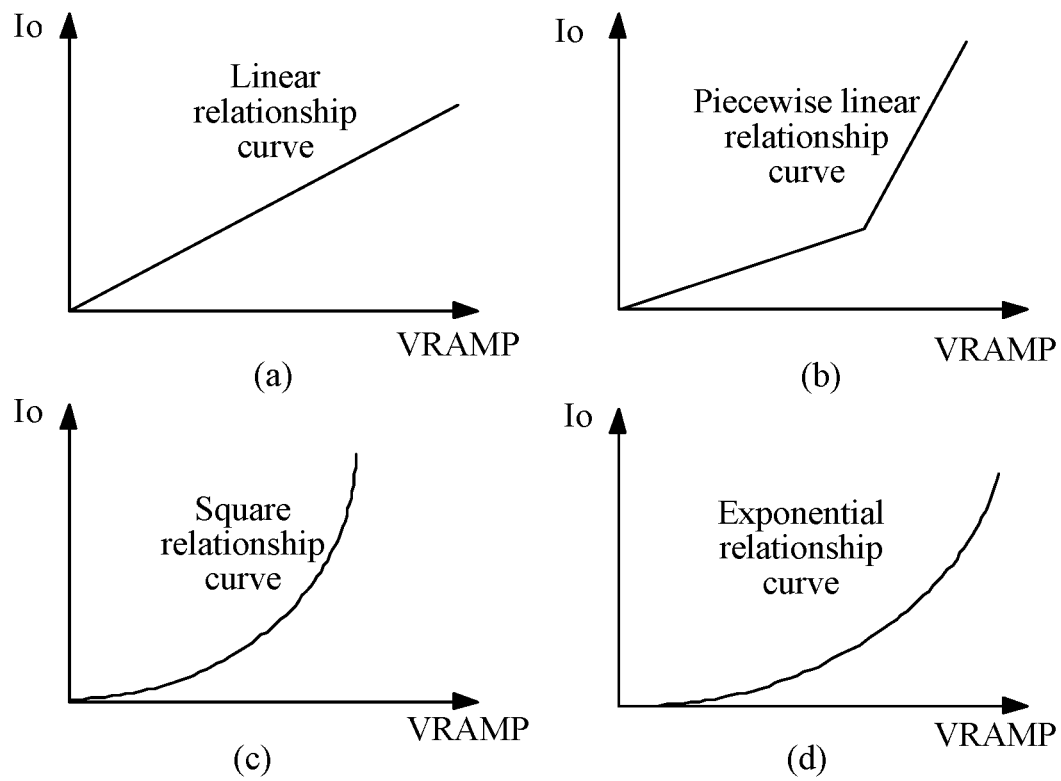
FIG. 3 is a schematic diagram illustrating a relationship between an input voltage and an output current of a voltage-current converter according to an embodiment of the disclosure.

In the embodiment of the disclosure, the voltage-current converter converts the output power control signal VRAMP into the control current Io. As illustrated in FIG. 3, there is a positive correlation relationship between the output current Io of the voltage-current converter and the input voltage VRAMP of the voltage-current converter. As illustrated in FIG. 3, panel (a), there is a linear relationship between the output current Io of the voltage-current converter and the input voltage VRAMP of the voltage-current converter. As illustrated in FIG. 3, panel (b), there is a piecewise linear relationship between the output current Io of the voltage-current converter and the input voltage VRAMP of the voltage-current converter. As illustrated in FIG. 3, panel (c), there is a square relationship between the output current Io of the voltage-current converter and the input voltage VRAMP of the voltage-current converter. As illustrated in FIG. 3, panel (d), there is an exponential relationship between the output current Io of the voltage-current converter and the input voltage VRAMP of the voltage-current converter.

Figure 4:
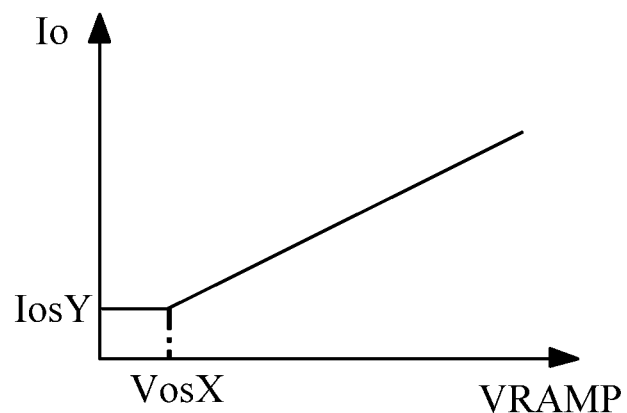
FIG. 4 is a schematic diagram illustrating a relationship between an output current and an input voltage of a power control circuit according to an embodiment of the disclosure.

As illustrated in FIG. 2, the power control circuit may further include a waveform shaper configured to perform starting point offset on a control current with respect to an output power control signal. An input-voltage-output-current diagram illustrating a starting point offset of the control current Io with respect to the output power signal VRAMP is illustrated in FIG. 4. When the output power control signal VRAMP is less than or equal to a voltage threshold VosX, Io value is equal to a set first current value IosY, where the voltage threshold VosX is a product of a set second current value IosX and a resistance R1. When the power control signal VRAMP is greater than the voltage threshold VosX, there is a positive correlation relationship between the control current Io and the output power control signal VRAMP, and the control current Io increases as the VRAMP increases. Here, the waveform shaper performs starting point offset on the control current Io, so that the power amplifier controlled by the bias current Ibase can satisfy the index requirements of forward isolation, a speed and the like.

Figure 5:
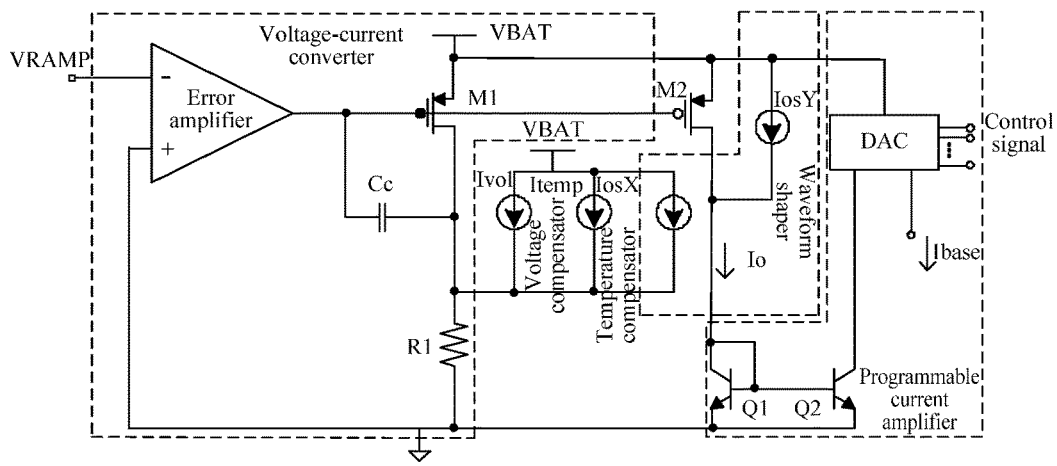
FIG. 5 is a schematic diagram illustrating a circuit composition structure of a power control circuit according to an embodiment of the disclosure.

FIG. 5 is a schematic diagram illustrating a circuit structure of a power control circuit according to an embodiment of the disclosure. FIG. 5 illustrates one of multiple specific implementation structures of the power control circuit illustrated in FIG. 2. As illustrated in FIG. 5, the power control circuit includes the following five parts: a voltage-current converter, a voltage compensator, a temperature compensator, a waveform shaper, and a programmable current amplifier DAC. Specifically, the voltage-current converter includes an error amplifier and field effect transistors M1 and M2, and the field effect transistors M1 and M2 may convert a voltage to a current. A drain of the field effect transistor M2 is connected to the programmable current amplifier DAC to supply an input current to the programmable current amplifier DAC. The programmable current amplifier DAC is controlled by an input signal of an own control end, and amplifies the received input current to a bias current Ibase in a ratio set by the input signal.

As illustrated in FIG. 5, in the embodiment of the disclosure, the waveform shaper includes a current source IosX and a current source IosY. The current source IosX and the current source IosY are constant current sources, and respectively output constant currents of IosX and IosY. The current source IosY is connected between a power supply VBAT and the drain of the field effect transistor M2, and the current source IosX is connected between the power supply VBAT and a drain of the field effect transistor M1. When the output power control signal VRAMP is small, the current source IosY outputs a constant current of IosY to the programmable current amplifier. When the output power control signal VRAMP exceeds the voltage threshold VosX, the field effect transistor M1 is turned on.

Figure 6:
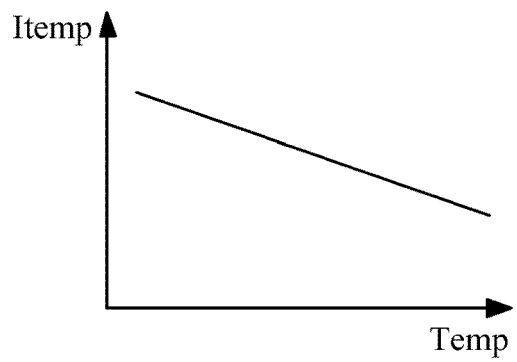
FIG. 6 is a schematic diagram illustrating a relationship between an output current and an output voltage of a current source used for a voltage compensator according to an embodiment of the disclosure.

As illustrated in FIG. 2, the power control circuit further includes a temperature compensator configured to compensate the control current when a temperature changes. As illustrated in FIG. 5, the temperature compensator includes a temperature controlled current source Itemp. As illustrated in FIG. 6, the temperature controlled current source Itemp is a temperature controlled current source negatively correlated with a temperature. As the temperature increases, an output current of the current source Itemp is decreased. However, a relationship between a value of the output current of the temperature controlled current source Itemp and the temperature is not limited to a linear relationship illustrated in FIG. 6. The use of the temperature controlled current source Itemp causes the control current Io to increase as the temperature Temp increases and decrease as a temperature Temp decreases. Then the power amplifier controlled by the bias current Ibase is caused to perform compensation through the bias current Ibase when the temperature Temp changes, so as to keep the output power stable.

Figure 7:
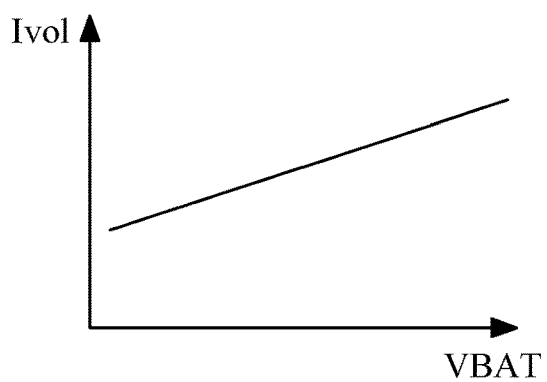
FIG. 7 is a schematic diagram illustrating a temperature-current relationship of a current source used for a temperature compensator according to an embodiment of the disclosure.

As illustrated in FIG. 2, the power control circuit further includes a voltage compensator configured to compensate the control current when the power voltage VBAT of the power amplifier changes. As illustrated in FIG. 5, the voltage compensator includes a voltage controlled current source Ivol. As illustrated in FIG. 7, the voltage controlled current source Ivol is a voltage controlled current source positively correlated with the power voltage VBAT. However, a relationship between a value of an output current of the voltage controlled current source Ivol and the power voltage VBAT is not limited to a linear relationship illustrated in FIG. 7. The use of the voltage controlled current source Ivol causes the control current Io to decrease as the power voltage VBAT increases, and increase as the power voltage VBAT decreases. Then the power amplifier controlled by the bias current Ibase is caused to perform compensation through the bias current Ibase when the power voltage VBAT namely a collector voltage of the power amplifier changes, so as to keep the output power stable.

As illustrated in FIG. 5, when being affected by the change in the temperature or the power voltage, the current outputted by the temperature controlled current source Itemp or the voltage controlled current source Ivol changes. Then a voltage across a resistor R1 changes, thus voltage values of gates of the field effect transistors M1 and M2 are affected, thereby affecting the output current Io and the bias current Ibase, compensating for the effect of change in the temperature or the power voltage on the power amplifier, and stabilizing an output power of the power amplifier.

In the power control circuit in the embodiments of the disclosure, an inputted output power control signal is detected by a voltage-current converter, and the output power control signal is converted into a control current. The control current is amplified by a programmable current amplifier, and the amplified control current is outputted as a bias current of a power amplifier connected to the power control circuit. It can be seen that the power control circuit in the embodiment of the disclosure is an open loop circuit, and the power amplifier can be controlled without a power transistor. Compared with the related art, the adverse effects of the power transistor and a closed loop are eliminated, and the performance of the power amplification circuit is improved.

The embodiment of the disclosure further provides a power amplification circuit. The power amplification circuit includes a power amplifier and a power control circuit. Specifically, the power control circuit is connected to the power amplifier, and configured to input a bias current to the power amplifier. The power amplifier is configured to amplify an inputted radio frequency signal according to the bias current, and then output the amplified signal.

Here, the power control circuit may adopt the composition and function of the power control circuit described in the above technical solution. For example, a power control circuit illustrated in FIG. 2 may be adopted.

Specifically, the voltage-current converter detects an inputted output power control signal VRAMP and converts the signal into a control current Io. The programmable current amplifier converts the control current Io into a bias current Ibase to be inputted to the power amplifier. Under the control of the bias current Ibase, a power amplifier U3 amplifies an inputted radio frequency input signal in a ratio set by the bias current Ibase, and then outputs the amplified signal.

A specific structure of the power control circuit illustrated in FIG. 2 is illustrated in FIG. 5. The power control circuit further includes a waveform shaper including a constant current source IosY and a constant current source IosX to perform starting point offset on the bias current Io with respect to the output power control signal VRAMP. In addition, the power control circuit further includes a voltage compensator and a temperature compensator to provide voltage compensation and temperature compensation for the power amplifier. The voltage compensator includes a voltage controlled current source Ivol, and the temperature compensator includes a temperature controlled current source Itemp.

In the power amplification circuit in the embodiments of the disclosure, by a voltage-current converter, an inputted output power control signal is detected and converted into a control current. The control current is amplified by a programmable current amplifier and the amplified control current is outputted as a bias current of a power amplifier connected to the power control circuit. It can be seen that the power control circuit in the embodiment of the disclosure is an open loop circuit, and the power amplifier can be controlled without a power transistor. Compared with the related art, the adverse effects of the power transistor and a closed loop are eliminated, and the performance of the power amplification circuit is improved.

The above is only the preferred embodiment of the disclosure and is not intended to limit the scope of protection of the disclosure.

Various embodiments of the present disclosure can have one or more of the following advantages: with a voltage-current converter, an inputted output power control signal is detected and converted into a control current. The control current is amplified by a programmable current amplifier, and the amplified control current is outputted as a bias current of a power amplifier connected to the power control circuit. It can be seen that the power control circuit in the embodiment of the disclosure is an open loop circuit, and the power amplifier can be controlled without a power transistor. Compared with the related art, the adverse effects of the power transistor and a closed loop are eliminated, and the performance of the power amplification circuit is improved.

The invention claimed is:

1. A power control circuit, comprising: a voltage-current converter and a programmable current amplifier, wherein
the voltage-current converter is configured to detect an inputted output power control signal, convert the output power control signal into a control current, and output the control current; and
the programmable current amplifier is configured to receive and amplify the control current, and output the amplified control current as a bias current of a power amplifier connected to the power control circuit, to thereby realize controlling the power amplifier with the power control circuit as an open loop circuit without a power transistor.

2. The power control circuit according to claim 1, further comprising: a waveform shaper, configured to perform starting point offset on the control current with respect to the output power control signal.

3. The power control circuit according to claim 2, wherein the waveform shaper comprises a constant current source.

4. The power control circuit according to claim 1, further comprising: a temperature compensator, configured to compensate the control current when a temperature changes.

5. The power control circuit according to claim 4, further comprising: a voltage compensator, configured to compensate the control current when a power voltage of the power amplifier changes.

6. The power control circuit according to claim 5, wherein the temperature compensator comprises a temperature controlled current source; and/or the voltage compensator comprises a voltage controlled current source.

7. The power control circuit according to claim 6, wherein there is a positive correlation relationship between an output current of the voltage-current converter and an input voltage of the voltage-current converter.

8. The power control circuit according to claim 7, wherein the positive correlation relationship comprises a linear relationship, a piecewise linear relationship, a square relationship or an exponential relationship.

9. The power control circuit according to claim 6, wherein the programmable current amplifier linearly amplifies the control current, and an amplification factor of the programmable current amplifier is controlled by programming the programmable current amplifier through a control signal.

10. A power amplification circuit, comprising a power amplifier, and the power control circuit according to claim 1, wherein
the power control circuit is connected to the power amplifier, and configured to input a bias current to the power amplifier; and
the power amplifier is configured to amplify an inputted radio frequency signal according to the bias current, and output the amplified signal.

11. The power amplification circuit of claim 10, wherein the power control circuit further comprises a waveform shaper, configured to perform starting point offset on the control current with respect to the output power control signal.

12. The power amplification circuit according to claim 11, wherein the waveform shaper comprises a constant current source.

13. The power amplification circuit according to claim 10, wherein the power control circuit further comprises a temperature compensator, configured to compensate the control current when a temperature changes.

14. The power amplification circuit according to claim 13, wherein the power control circuit further comprises a voltage compensator, configured to compensate the control current when a power voltage of the power amplifier changes.

15. The power amplification circuit according to claim 14, wherein the temperature compensator comprises a temperature controlled current source; and/or the voltage compensator comprises a voltage controlled current source.

16. The power amplification circuit according to claim 15, wherein there is a positive correlation relationship between an output current of the voltage-current converter and an input voltage of the voltage-current converter.

17. The power amplification circuit according to claim 16, wherein the positive correlation relationship comprises a linear relationship, a piecewise linear relationship, a square relationship or an exponential relationship.

18. The power amplification circuit according to claim 15, wherein the programmable current amplifier linearly amplifies the control current, and an amplification factor of the programmable current amplifier is controlled by programming the programmable current amplifier through a control signal.

19. The power amplification circuit according to claim 18, wherein the power amplifier is controlled without the power transistor to thereby reduce adverse effects of the power transistor and a closed loop, and improving performance of the power amplification circuit.

\* \* \* \* \*